United States Patent
Liu

(10) Patent No.: US 10,636,913 B2
(45) Date of Patent: Apr. 28, 2020

(54) SEMICONDUCTOR STRUCTURE HAVING FIN STRUCTURES WITH DIFFERENT GATE LENGTHS AND METHOD OF FABRICATING THEREOF

(71) Applicant: Avago Technologies International Sales Pte. Limited, Singapore (SG)

(72) Inventor: Qing Liu, Irvine, CA (US)

(73) Assignee: Avago Technologies International Sales Pte. Limited, Singapore (SG)

(*) Notice: Subject to any disclaimer, the term of this patent is extended or adjusted under 35 U.S.C. 154(b) by 0 days.

(21) Appl. No.: 16/052,138

(22) Filed: Aug. 1, 2018

(65) Prior Publication Data

US 2020/0044094 A1    Feb. 6, 2020

(51) Int. Cl.
  *H01L 29/786* (2006.01)
  *H01L 27/088* (2006.01)
  *H01L 21/8234* (2006.01)
  *H01L 21/223* (2006.01)
  *H01L 21/28* (2006.01)
  *H01L 29/10* (2006.01)

(52) U.S. Cl.
  CPC ...... *H01L 29/78642* (2013.01); *H01L 21/223* (2013.01); *H01L 21/2822* (2013.01); *H01L 21/823456* (2013.01); *H01L 27/088* (2013.01); *H01L 29/1037* (2013.01)

(58) Field of Classification Search
  CPC ......... H01L 29/78642; H01L 21/02263; H01L 21/32; H01L 21/82385; H01L 21/823842; H01L 21/823864
  See application file for complete search history.

(56) References Cited

U.S. PATENT DOCUMENTS

| | | | |
|---|---|---|---|
| 10,008,417 B1* | 6/2018 | Bao | H01L 21/823487 |
| 10,141,448 B1* | 11/2018 | Miao | H01L 29/78642 |
| 2015/0187766 A1* | 7/2015 | Basker | H01L 27/0886 257/365 |

* cited by examiner

*Primary Examiner* — Dung A. Le
(74) *Attorney, Agent, or Firm* — Foley & Lardner LLP

(57) ABSTRACT

A method of fabricating a semiconductor structure includes forming a plurality of Fin structures, doping first dopants at both sides of a first Fin structure of the Fin structures, and providing a first thermal diffusion operation to the semiconductor structure. The method also includes doping second dopants at both sides of a second Fin structure of the Fin structures, and providing a second thermal diffusion operation to the semiconductor structure. A first gate length for the first Fin structure is formed using the first and the second thermal diffusion operations, and a second gate length for the second Fin structure using the second thermal diffusion operation. The first dopants are of the same type or a different type.

20 Claims, 13 Drawing Sheets

SEMICONDUCTOR STRUCTURE HAVING FIN STRUCTURES WITH DIFFERENT GATE LENGTHS AND METHOD OF FABRICATING THEREOF

FIELD OF THE DISCLOSURE

This disclosure generally relates to systems and methods of realizing multiple gate lengths in transistors including but not limited to systems and methods of realizing multiple gate lengths in vertical transistors.

BACKGROUND OF THE DISCLOSURE

A FinFET, also known as a Fin Field Effect Transistor, is non-planar transistor used in the design of modern processors. The FinFET allows multiple gates to operate in a single transistor. However, FinFET design effective device width (Weff) is often limited to the integral multiple of a fin height. The width quantization is one of the inherent constraints of using multigate devices for designing logic or analog circuit.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
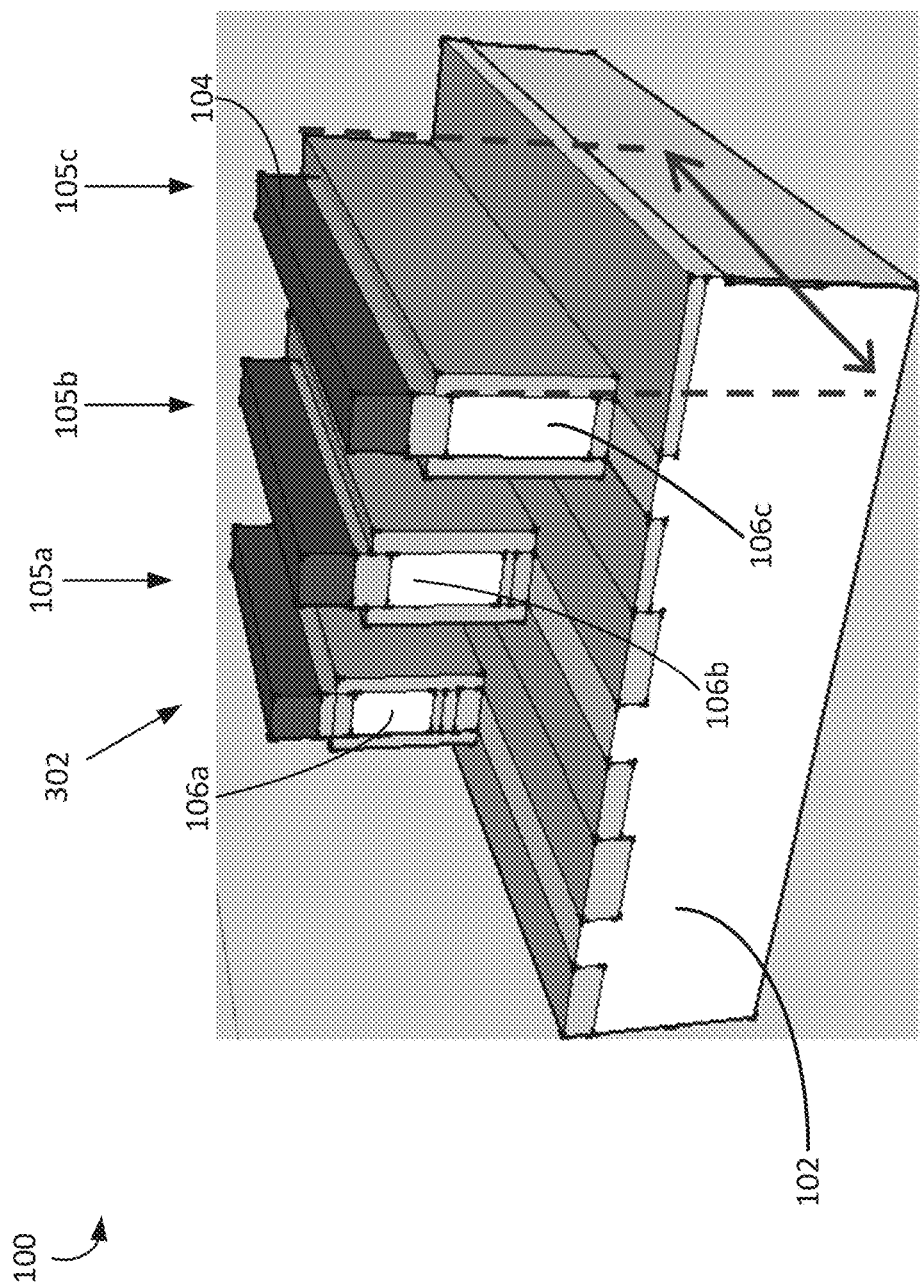
FIG. 1 is a perspective view schematic drawing of a semiconductor structure according to some embodiments.

Before turning to the features, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems and methods of realizing multiple gate length in vertical transistor device are shown according to various exemplary embodiments. A structure of a vertical transistor has flexible design length and/or width in that a vertical channel of the vertical transistor frees up the dimension along the fin length direction in some embodiments. The structure is also an independent gate FinFET structure which can tailor desirable voltage shift through dynamically adjusting a threshold voltage of the structure in some embodiments. The structure of the vertical transistor offers flexibility of gate length/width of the transistor that can be used for adjusting static random access memory (SRAM) beta ratio and achieve best read static noise margin (SNM) in SRAM without using discrete multiple of fin count as in conventional FinFET in some embodiments. The systems and methods of realizing multiple gate lengths in vertical transistor devices utilize the dopant diffusion characteristics to form different effective gate length within vertical transistor according to some embodiments.

Some embodiments relate to semiconductor structure including a substrate, and Fin structures formed on top of the substrate. Each Fin structure includes a top drain/source region, a bottom drain/source region, and a gate connecting between the top drain source region and the bottom drain/source region. Each gate has a different gate length. The first dopants and the second dopants are the same type or are different type dopants Some embodiments relate to a method of fabricating a semiconductor structure. The method includes forming a plurality of Fin structures, doping first dopants at both sides of a first Fin structure of the Fin structures, and providing a first thermal diffusion operation to the semiconductor structure. The method also includes doping second dopants at both sides of a second Fin structure of the Fin structures, and providing a second thermal diffusion operation to the semiconductor structure. A first gate length for the first Fin structure is formed using the first and the second thermal diffusion operations, and a second gate length for the second Fin structure using the second thermal diffusion operation. The first dopants are of the same type or a different type.

Some embodiments relate to a method of fabricating a vertical transistor. The method includes forming Fin structures in a semiconductor substrate, doping first dopants into a top surface of the substrate at both sides of a first Fin structure of the Fin structures, and providing a first thermal diffusion operation to the semiconductor structure. The method also includes doping second dopants into the top surface of the substrate at both sides of a second Fin structure of the Fin structures, and providing a second thermal diffusion operation to the semiconductor structure. A first gate length for the first Fin structure is formed using the first and the second thermal diffusion operations, and a second gate length for the second Fin structure is formed using the second thermal diffusion operation. The first gate length and the second gate length are different, and the first dopants and the second dopants are the same type or are different type dopants.

Figure 2:
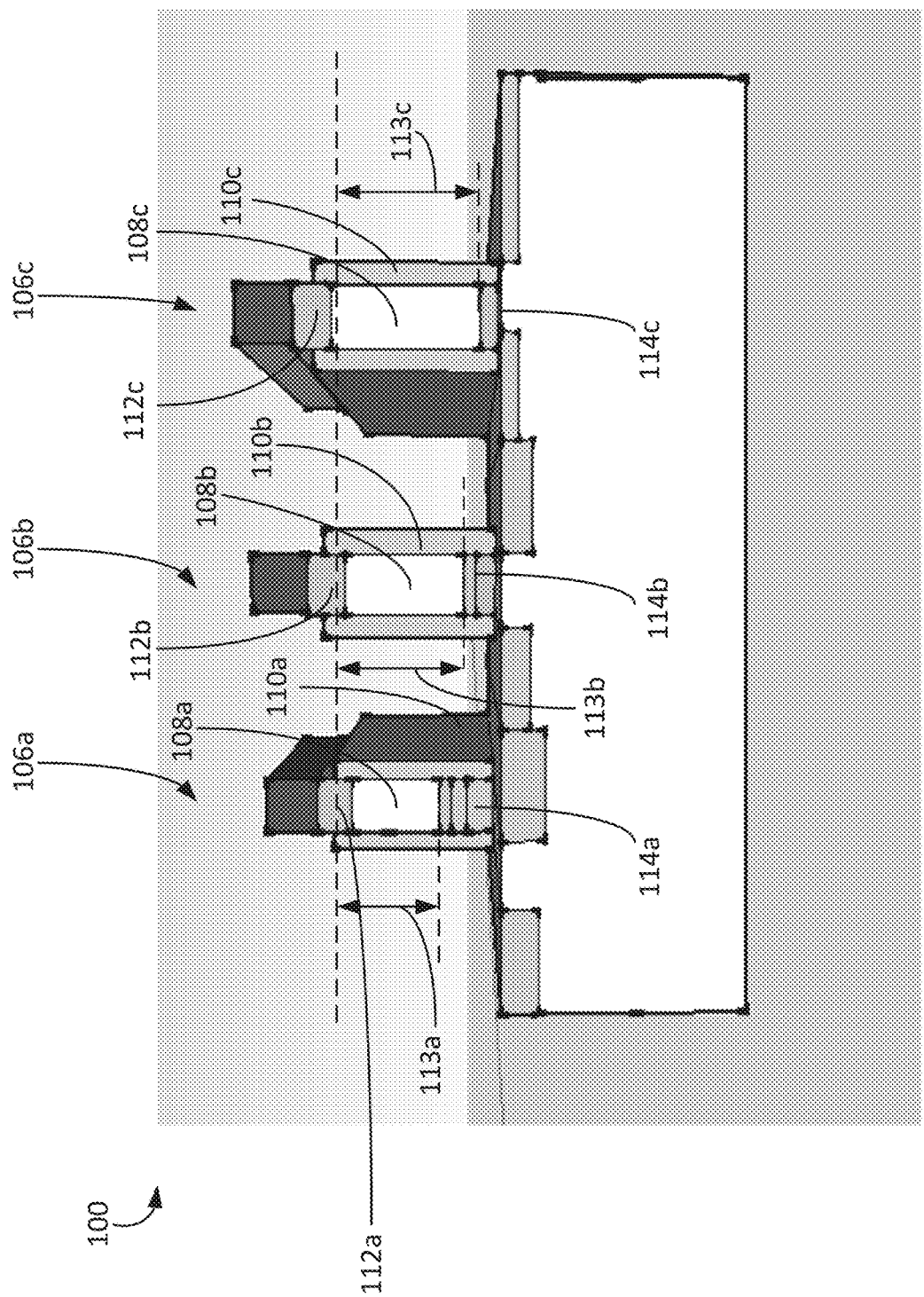
FIG. 2 is a cross-sectional view schematic drawing of the semiconductor structure illustrated in FIG. 1 according to some embodiments.

With reference to FIGS. 1 and 2, a semiconductor structure semiconductor structure 100 includes transistors 105a, 105b, and 105c disposed on a substrate 102. A Fin hard mask (HM) cap 302 made from an HM layer 104 is disposed above multiple Fin structures (e.g., Fin structures 106a, 106b, and 106c) according to some embodiments. The Fin HM mask 104 defines the width and length of the Fin structures 106a-c. Each of the transistors 105a, 105b, and 105c includes a respective gate 110a-c, a bottom drain/source 114a-c, a top drain/source 112a-c, and a channel 108a-c (FIG. 2) according to some embodiments. The transistors 105a-c are vertical transistors coupled to other devices on the substrate 102 in some embodiments. The position, characteristics, and sizes of the drain/source s 122a-c and 114a-c can be interchanged in some embodiments. The term "drain/source" refers to a source or a drain in some embodiments.

The multiple Fin structures 106a, 106b, and 106c have different Fin width (left to right in FIG. 2), a different gate length 113a-c (e.g., distance between the drain/sources 112a-c and 114a-c, and different gate depth (into the page in FIG. 2) according to device parameters associated with the transistors 105a, 105b, and 105c according to some embodiments. The transistors 105a, 105b, and 105c are formed according to transistor requirements for a corresponding device that is connected to the transistor according to some embodiments. The transistor requirements include, but are not limited to, a width of the transistor, a depth of the transistor, and a gate length of the transistor according to some embodiments. For example, each of the transistors 105a, 105b, and 105c is formed with a flexible design width that meets a gate length requirement of a corresponding device that is connected to the transistor according to some embodiments.

Each of the transistors 105a, 105b, and 105c is formed according to a gate requirement of a corresponding device that is connected to the transistors 105a-c according to some embodiments. The gate requirement includes, but is not limited to, a respective channel length or gate length 113a-c according to some embodiments. For example, each of the transistors 105a-c has a flexible design length that meets a depth requirement of a corresponding device that is connected to the respective transistors 105a-c according to some embodiments. As shown in FIGS. 1 and 2, the gates 110a, 110b, and 110c have different depth according to some embodiments.

For example, as shown in FIG. 2, the top drain/source 112a, the bottom drain/source 114a, and the gate 110a, and the channel 108a are disposed on or in the Fin structure 106a according to some embodiments. The gate 110a is disposed on both side of the fin structure 108a and overlaps the top drain/source 112a and the bottom drain/source 114a according to some embodiments. The channel 108a extends from the top drain/source 112a and to the bottom drain/source 114a according to some embodiments. The gate length 113a of the gate 110a is defined by the depth of the bottom drain/source 114a according to some embodiments. The depth of the bottom drain/source 114a is determined according to a gate length requirement for the applications of the transistor 105a associated with a first device that is connected to the transistor 105a according to some embodiments.

Similar to the Fin structure 106a, the top drain/source 112b, the bottom drain/source 114b, the gate 110b, and the channel 108b are disposed on or in the Fin structure 106b according to some embodiments. The gate length 113b of the gate 110b is determined according to a gate length requirement for the applications of the transistor 105b associated with a second device that is connected to the transistor 105b according to some embodiments. When the gate length requirements associated with the transistor 105a and the transistor 105b are different, the gate length 113a and the gate length 113b are formed with different depth accordingly in some embodiments.

Similar to the Fin structures 106a and 106b, the top drain/source 112c, the bottom drain/source 114c, the gate 110c, and the channel 108c are disposed on or in the Fin structure 106c according to some embodiments. The gate length 113c is determined according to a gate length requirements for the applications of the transistor 105c associated with a third device that is connected to the transistor 105c according to some embodiments. When the gate length requirements associated with the transistor 105c is different from the requirements associated with the transistor 105a and the transistor 105b, the gate 110c is formed with a gate length 113c that is different from the gate lengths 113a and 113b a in some embodiments. For example, the gate 110a has a gate length 113a which is the distance between the top drain/source 112a and the bottom drain/source 114a. Similar to the gate 110a, the gate 110b has a gate length 113b, and the gate 110c has a gate length 113c according to some embodiments. The gate length 113a, 113b, and 113c are different from each other, and are adjustable using fabrication techniques and time periods according to specific applications of the semiconductor structure 100 according to some embodiments.

Figure 3:
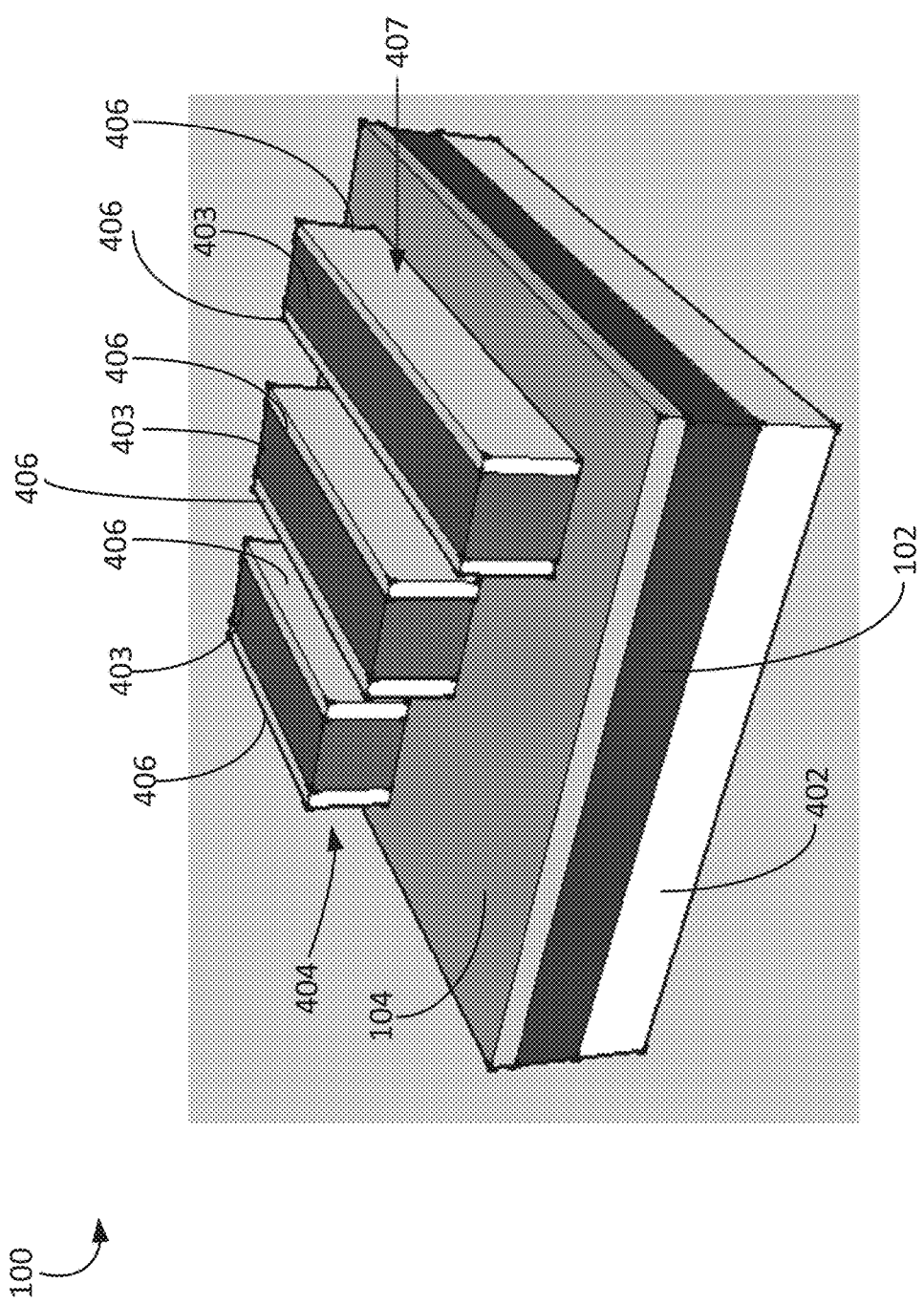
FIG. 3 is a perspective view schematic drawing of the semiconductor structure illustrated in FIG. 1 after forming the Fin structures in the substrate according to some embodiments.
Figure 4:
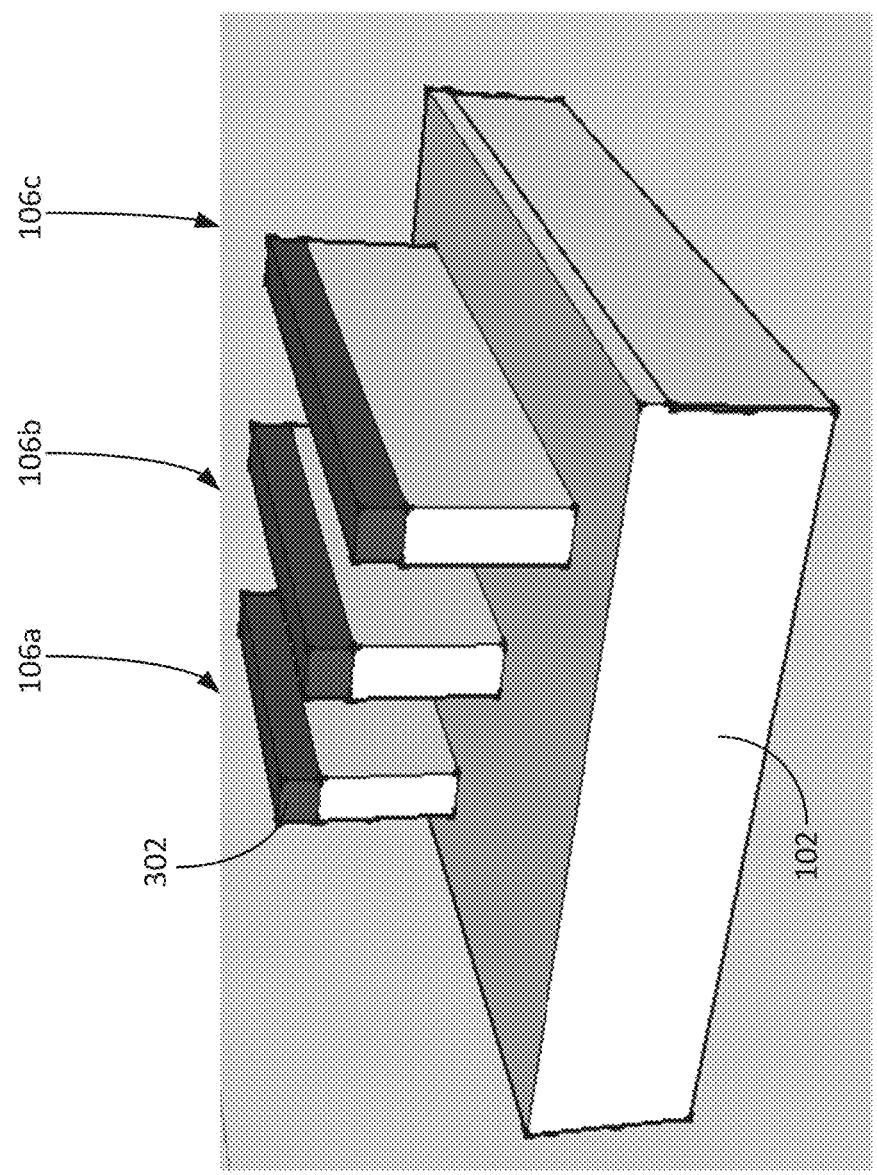
FIG. 4 is a cut-away perspective view schematic drawing of a portion the semiconductor structure illustrated in FIG. 1 after forming oxide side walls on the Fin structures according to some embodiments.

An exemplary process for fabricating the semiconductor structure 100 is described below with reference to FIGS. 1-13 according to some embodiments. With reference to FIGS. 3 and 4, the semiconductor structure 100 includes the substrate 102 and an insulation layer 402 below the substrate 102 according to some embodiments. The insulation layer 402 is formed of an insulating material, such as, oxide (e.g., $SiO_2$ or a buried oxide layer) according to some embodiments. The layer 402 is not shown in other drawings for simplicity. The HM layer 104 is formed on top of the substrate 102 by depositing HM material on the substrate 102 followed by lithography patterning and etching process to leave the Fin HM cap 302 (FIG. 1) according to some embodiments. The HM layer 104 (FIG. 1) can be formed using any suitable material, such as, for example, a nitride or silicon nitride according to some embodiments. The HM layer 104 can be deposited by a deposition process including, but not limited to chemical vapor deposition (CVD), physical vapor deposition (PVD), plasma enhanced CVD, atomic layer deposition (ALD), evaporation, chemical solution deposition, or like processes according to some embodiments.

In some embodiments, the hard mask layer 104 is patterned using an oxide process to achieve fin structure widths smaller than conventional lithographic techniques (e.g., to provide narrower fin structures 106a-c). The hard mask layer 104 is coated with a polysilicon or amorphous silicon layer 403 which is lithographically patterned to leave a mask 404. The layer 403 can be deposited by a deposition process including, but not limited to chemical vapor deposition (CVD), physical vapor deposition (PVD), plasma enhanced CVD, atomic layer deposition (ALD), evaporation, chemical solution deposition, or like processes according to some embodiments. A shallow trench isolation process is provided over the mask 404 leaving oxide sidewalls or STI spacers 406 on the mask 404. The STI spacers 406 are formed by first conformally depositing one more dielectric layers and then performing an anisotropic etch process according to some embodiments. The mask 404 is removed to provide a mask 407 formed from the STI spacers 406. The STI spacers 406 can include an insulating material, for example, silicon dioxide, silicon nitride, SiOCN, or SiBCN according to some embodiments. The material for the STI spacer 4061 can be deposited by a deposition process, for example, CVD or PVD and etched to leave the STI spacers as the mask 407 above the HM layer 104 according to some embodiments.

With reference to FIG. 4, the pattern of the mask 407 associated with the spacers 406 is transferred to the hard mask layer 104 using an etching process selective to the material of the hard mask layer 104 to leave the Fin cap mask 302. The substrate 102 is subjected to one or more of anisotropic dry etches, such as reactive-ion etching (RIE) or a plasma etching process, which patterns the substrate 102 to form the fin structure 106*a*, 106*b*, and 106*c*. The fin structures 106*a-c* have an upper surface covered by the Fin cap mask 302 as shown in FIG. 4 representing residual material from the patterned HM layer 104 according to some embodiments. Although six STI spacers 406 are shown in FIG. 3, the formation of three Fin structures 106*a-c* is described below for simplicity.

The Fin structures 106*a*, 106*b*, and 106*c* are formed on or in the substrate 102 by an etching process according to some embodiments. The substrate 102 includes a bulk semiconductor substrate or a semiconductor-on-insulator (SOI) substrate. In some embodiments, the substrate 102 can be formed using any suitable material, such as silicon, silicon germanium, germanium, etc. The substrate 102 can include other structures (not shown) such as isolation, doped wells that can be formed by implantation and doping techniques. The Fin structures 106*a*, 106*b*, and 106*c* are formed by etching by, for example, reactive ion etching, dry etching process (e.g., RIE) or other process selective to the semiconductor layer below the hard mask layer 104 according to some embodiments. The process defines device receiving area by defining the width of the Fin structures 106*a*, 106*b*, and 106*c* on the substrate 102 according to some embodiments. The depth or height of the fin structures 106*a-c* is controlled by process selection in some embodiments. Although three Fin structures 106*a*, 106*b*, and 106*c* are shown, any number of Fin structures, or an array of Fin structures can be formed in the substrate 102 according to some embodiments.

Figure 5:
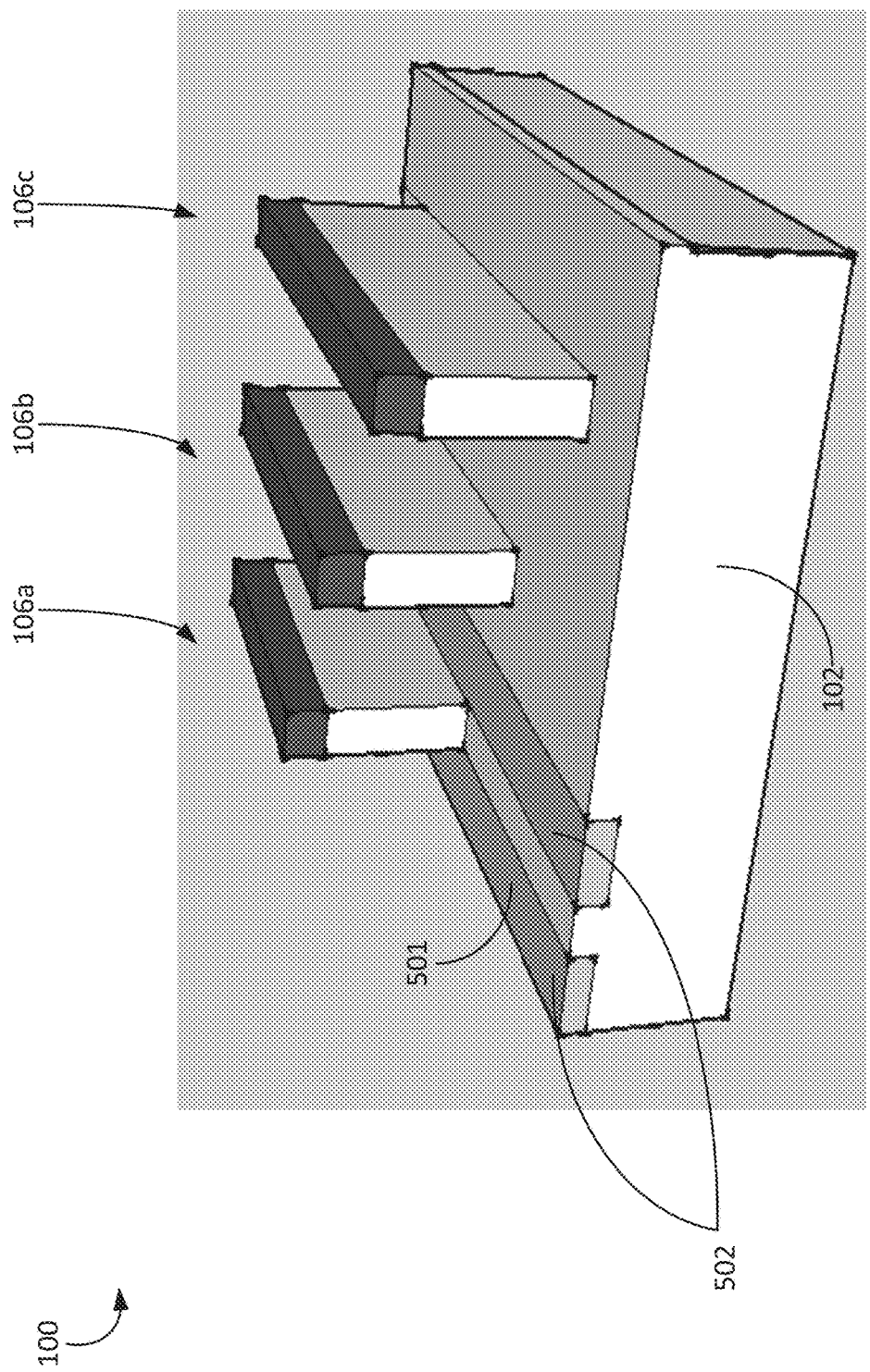
FIG. 5 a perspective view schematic drawing of the semiconductor structure illustrated in FIG. 1 with a first doped region according to some embodiments.

With reference to FIG. 5, the semiconductor structure 100 is subjected to a first doping operation according to some embodiments. After the Fin structures 106*a*, 106*b*, and 106*c* are formed, dopants are doped in a first region 502 of the substrate 102 at each side of a first Fin structure 106*a* according to some embodiments. The first region 502 includes an area connecting the substrate 102 and the first Fin structure 106*a* according to some embodiments. For example, as shown in FIG. 5, dopants are first doped at both sides of the first Fin structure 106*a* into a top surface 501 of the substrate 102 according to some embodiments. The dopants are used to form the drain/source 114*a* (FIG. 1) of the transistor 105*a* for a first device that is connected to the first Fin structure 106*a* according to some embodiments. The dopants can be any suitable types dopants, such as positive-type (P-type) or negative-type (N-type) dopants and are implanted by ion implantation according to some embodiments. In some embodiments, the dopants have thermal diffusion characteristic according to some embodiments. The dopants can diffuse into the Fin structures 106*a-c* when a temperature of the substrate increases to a temperature threshold according to some embodiments. The Fin structures 106*b-c* and the top surface 501 are masked to prevent dopants from being implanted in regions other than regions 502. The mask is a photoresist mask or a lithographically formed hard mask in some embodiments.

Figure 6:
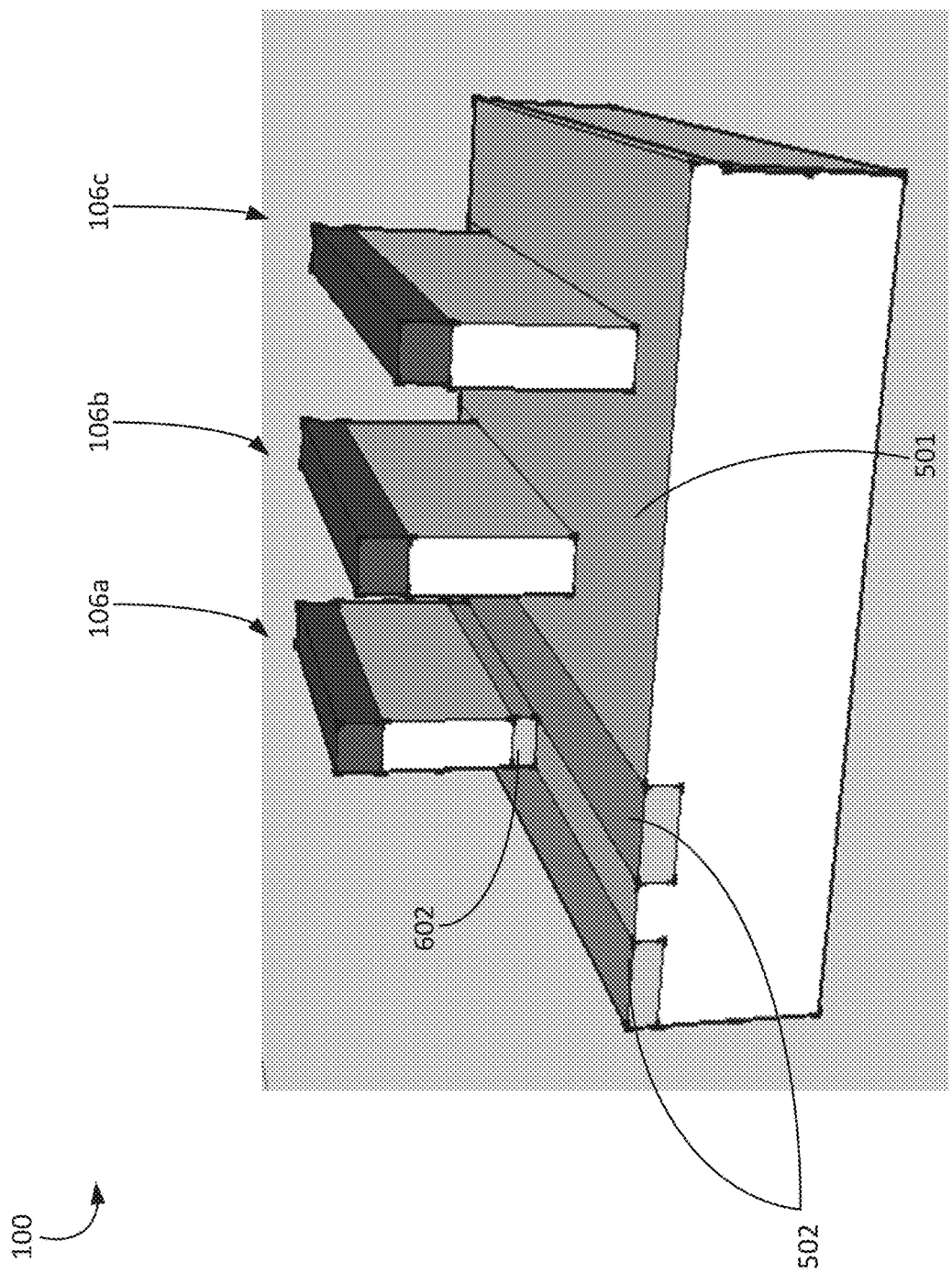
FIG. 6 is a perspective view schematic drawing of the semiconductor structure illustrated in FIG. 1 with a first doped thermal diffusion region 5 according to some embodiments.

With respect to FIG. 6, the semiconductor structure 100 is subjected to a first thermal diffusion operation is shown according to some embodiments. The dopants can be thermally driven into the Fin structure 106*a* to form the external junction and determine gate length 113*a* (FIG. 1) of the vertical transistor 105*a* according to some embodiments. For example, when a desired temperature applied to the semiconductor structure 100 for a first period of time, the dopants doped in the first region 502 start diffusing into the Fin structure 106*a* during the first period of time according to some embodiments. The diffusion is stopped when the temperature drops below the temperature threshold according to some embodiments. When the thermal diffusion stops, the first Fin structure 106*a* includes a first portion 602 of the dopants such that a first gate length 113*a* of the first Fin structure 106*a* is changed according to some embodiments. The diffused dopants form the junction between the Fin structure 106*a* and the substrate 102 according to some embodiments.

Figure 7:
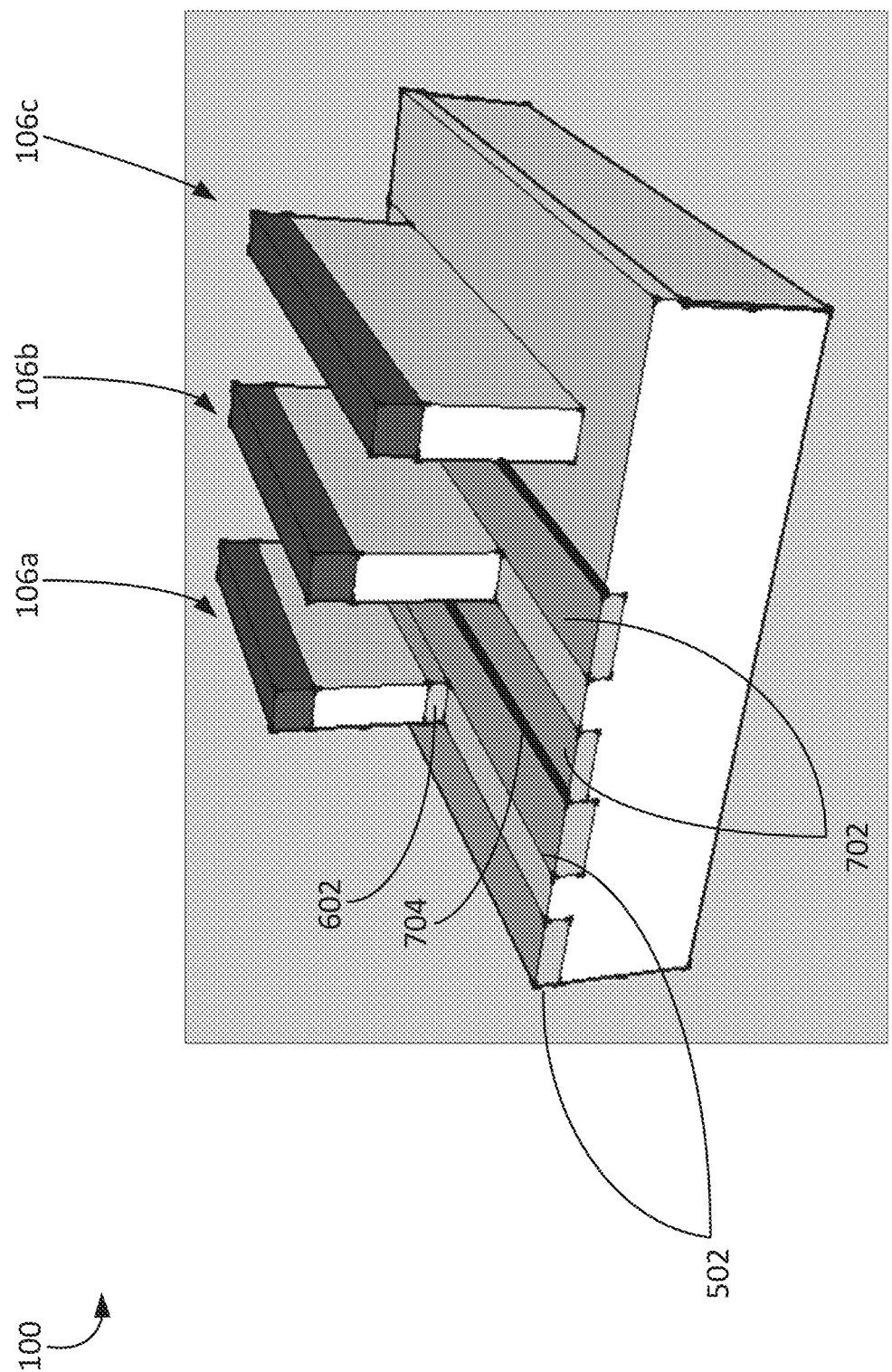
FIG. 7 is a perspective view schematic drawing of the semiconductor structure illustrated in FIG. 1 with a second doped region according to some embodiments.

With respect to FIG. 7, a cross-sectional view of the semiconductor structure 100 is subjected to a second doping operation according to some embodiments. Upon completing the first doping and thermal diffusion as shown in FIGS. 5-6, dopants are doped in a second region 702 in the top surface 501 of the substrate 102 at each side of a second Fin structure 106*b* according to some embodiments. The second region 702 includes an area connecting the substrate 102 and the second Fin structure 106*b* according to some embodiments. The dopants are implanted to form a terminal as the drain/source 114*b* of the transistor 105*b* for a second device that is connected to the second Fin structure 106*b* according to some embodiments. The gate length 113*b* of the transistor 105*b* is different than the gate length 113*a* (FIG. 1) compared to the first device according to some embodiments. The second device has a gate length 113*b* of the transistor 105*b* having the same gate length 113*a* as used by the first device according to some embodiments. The Fin structure 106*c* and the top surface 501 are masked to prevent dopants from being implanted in regions other than regions 502 and 702. The mask is a photoresist mask or a lithographically formed hard mask in some embodiments.

In some embodiments, when different gate lengths 113*a-b* of the transistors 105*a-b* are formed, a block mask layer 704 is formed between the first region 502 and the second region 702 within the substrate 102 according to some embodiments. The block mask layer 704 is a STI layer that isolates dopants diffusion between the first region 502 and the second region 702 according to some embodiments.

Figure 8:
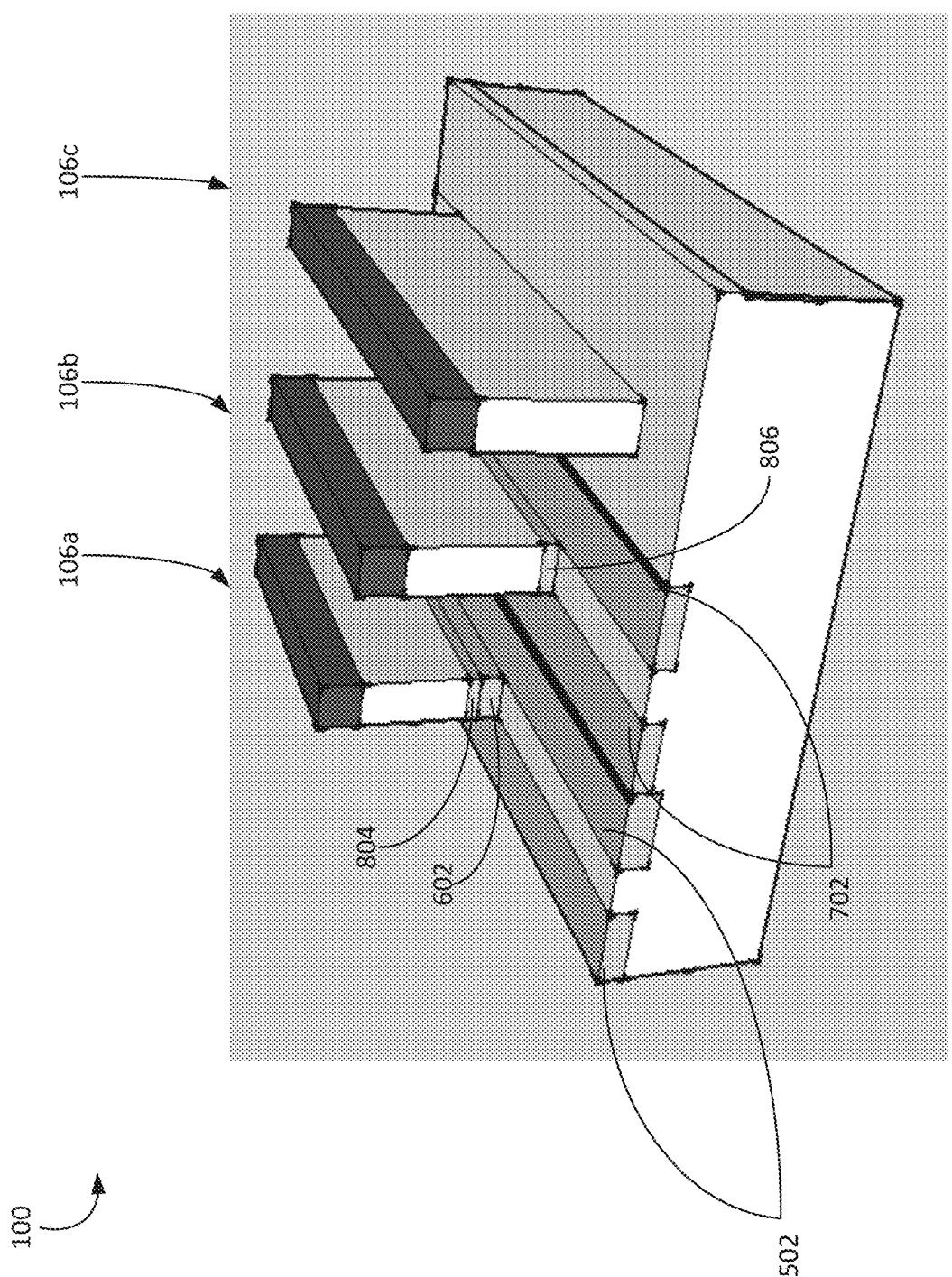
FIG. 8 is a perspective view schematic drawing of the semiconductor structure illustrated in FIG. 1 with a second doped thermal diffusion region according to some embodiments.

With respect to FIG. 8, the semiconductor structure 100 is subject to a second thermal diffusion operation according to some embodiments. The temperature is increased to the desired temperature for a second period of time such that the dopants within the second region 702 can be diffused into the second Fin structure 106*b* according to some embodiments. When the temperature of the semiconductor structure 100 reaches to the desired temperature, the dopants in the first region 502 and the dopants in the second region 702 are both driven into the respective Fin structures 106a and 106b during the second period of time according to some embodiments. When the temperature of the semiconductor structure 100 drops below the temperature threshold, the dopants in both the first region 502 and the second region 702 stops diffusing according to some embodiments. Upon completing the second thermal diffusion operation, the first Fin structure 106a includes a second portion 804 of dopants diffused into the Fin structure 106a and the first portion 602 of dopants, and the second Fin structure 106b includes a first portion 806 of dopants according to some embodiments.

Figure 9:
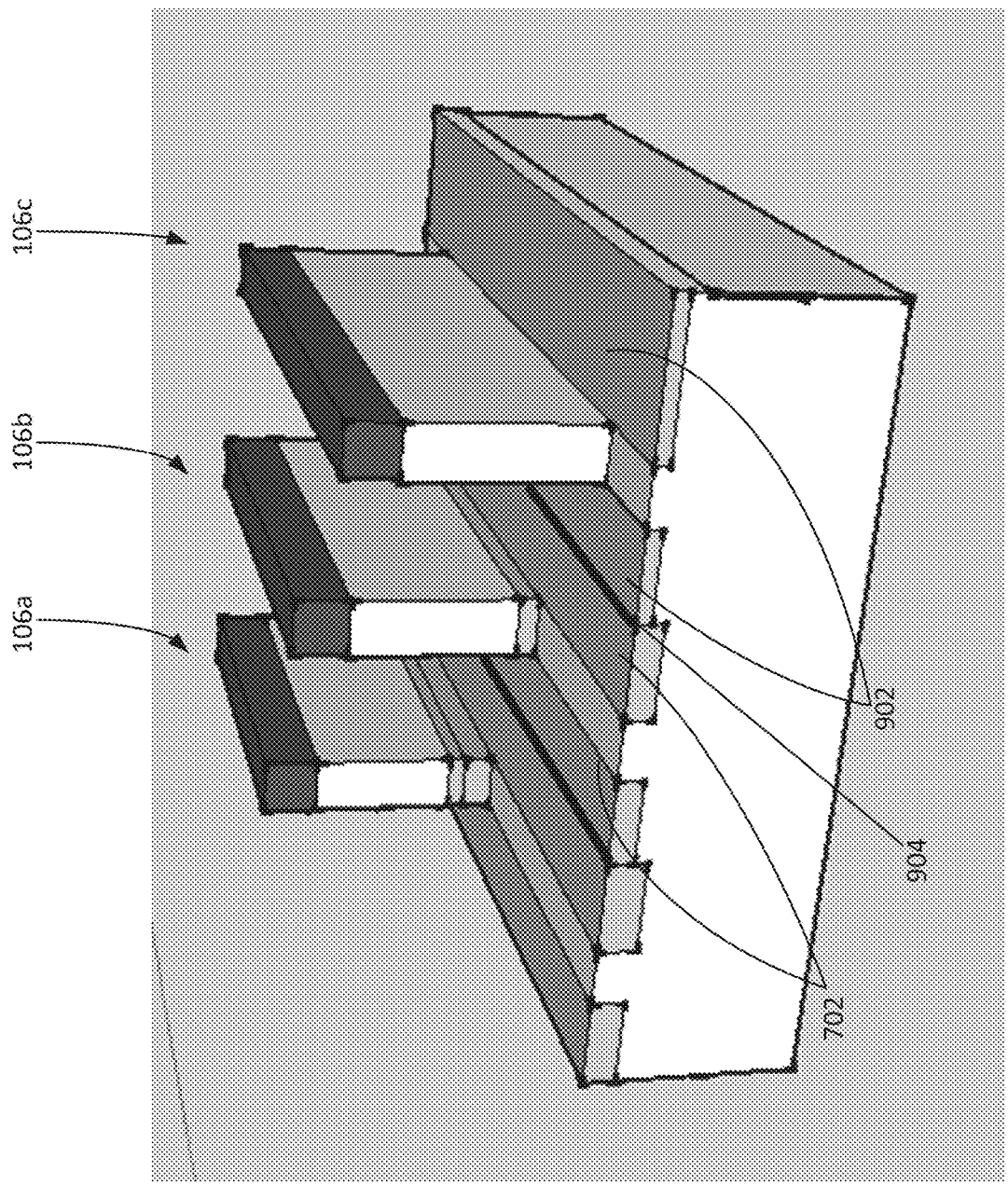
FIG. 9 is a perspective view schematic drawing of the semiconductor structure illustrated in FIG. 1 with a third doped region according to some embodiments.

With respect to FIG. 9, the semiconductor structure 100 is subjected to a third doping according to some embodiments. Upon completing the second doping and thermal diffusion as shown in FIGS. 7-8, dopants are doped in a third region 902 of the substrate 102 at each side of a third Fin structure 106c according to some embodiments. The third region 902 includes an area connecting the substrate 102 and the third Fin structure 106c according to some embodiments. The dopants are doped to form a terminal for the transistor 105c for a third device that is connected to the third Fin structure 106c according to some embodiments.

When the gate length 113c is different from the gate lengths 113a-b, a block mask layer 904 is formed between the second region 702 and the third region 902 within the substrate 102 according to some embodiments. The block mask layer 904 is a STI layer that isolates dopants diffusion between the second region 702 and the third region 902 according to some embodiments.

Figure 10:
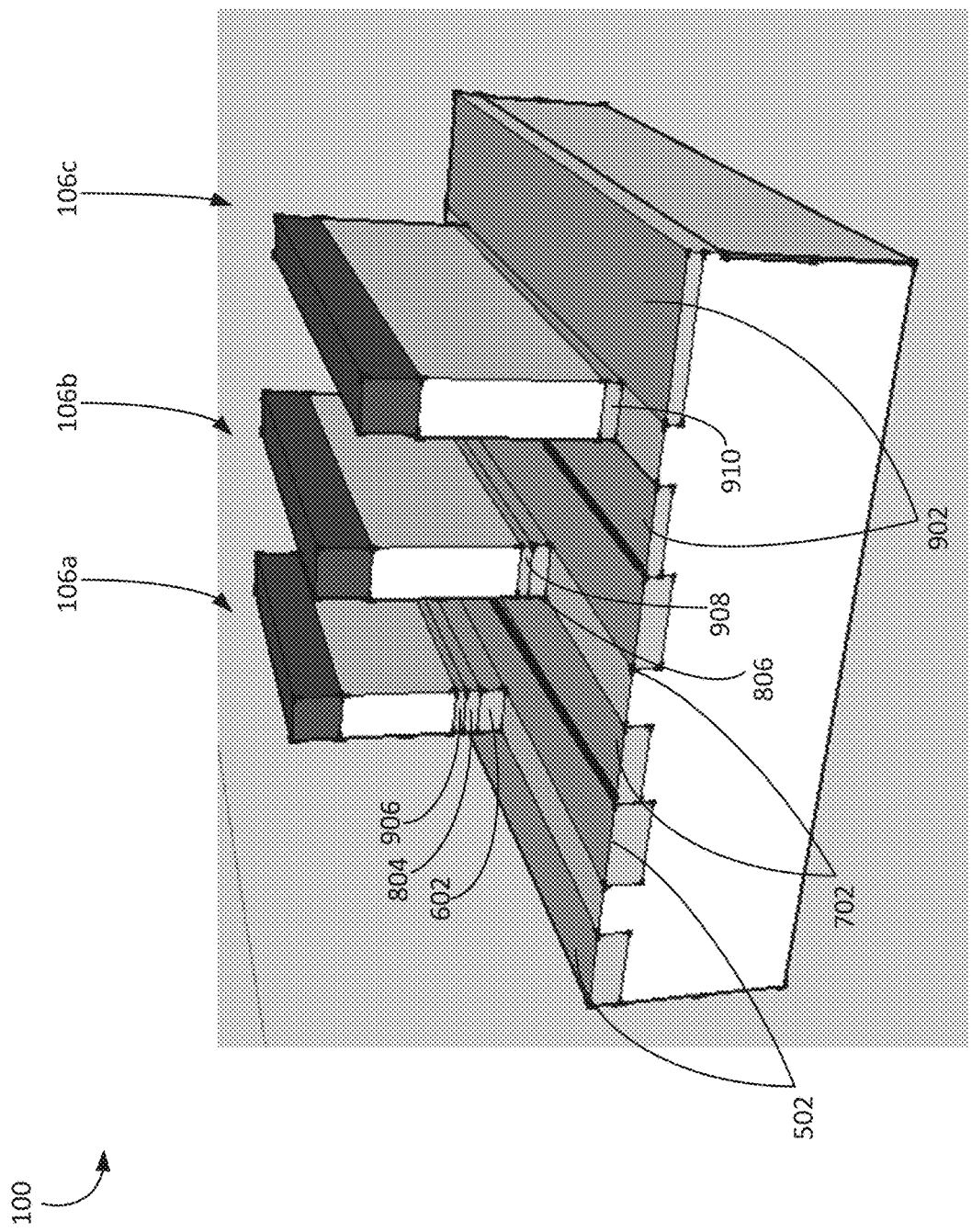
FIG. 10 is a perspective view schematic drawing of the semiconductor structure illustrated in FIG. 1 with a third doped thermal diffusion region according to some embodiments.

With respect to FIG. 10, the semiconductor structure 100 is subjected to a third thermal diffusion operation according to some embodiments. The temperature is increased again to the desired temperature for a third period of time such that the dopants within the third region 902 can be diffused into the third Fin structure 106c according to some embodiments. When the temperature of the semiconductor structure 100 reaches to the desired temperature, the dopants in the first region 502, the dopants in the second region 702, and the dopants in the third region 902 are all driven into the respective Fin structures 106a, 106b, and 106c during the third period of time according to some embodiments. When the temperature of the semiconductor structure 100 drops below the temperature threshold, the dopants in the first region 502, the second region 702, and the third region 902 stops diffusing according to some embodiments. Upon completing the third doping and thermal diffusion, the Fin structure 106a has the first portion 602, the second portion 804, and the third portion 906 of dopants diffused into the Fin structure 106a, the Fin structure 106b has the first portion 806 and the second portion 908 of dopants diffused into the Fin structure 106b, and the Fin structure 106c has a first portion 910 diffused into the Fin structure 106c according to some embodiments. The diffused portions 602, 806, and 902 form bottom drain/source portions of the respective drain/source s 114a-c in each Fin structure 106a-c according to some embodiments.

The first time period, the second time period, and the third time period are determined according to the requirements of the gate lengths of each Fin structure 106a, 106b, and 106c for the first, the second, and the third devices according to some embodiments. The amounts of dopants doped into the first region, the second region, and the third region are also determined according to the requirements of the gate lengths 113a-c of each Fin structure 106a, 106b, and 106c by the first, the second, and the third devices according to some embodiments. The first, second, and third doping and thermal diffusion processes are conducted in a predetermined manner such that each Fin structure 106a, 106b, and 106c has a desired gate length 113a-c for a respective device that connects to the corresponding Fin structure according to some embodiments.

Figure 11:
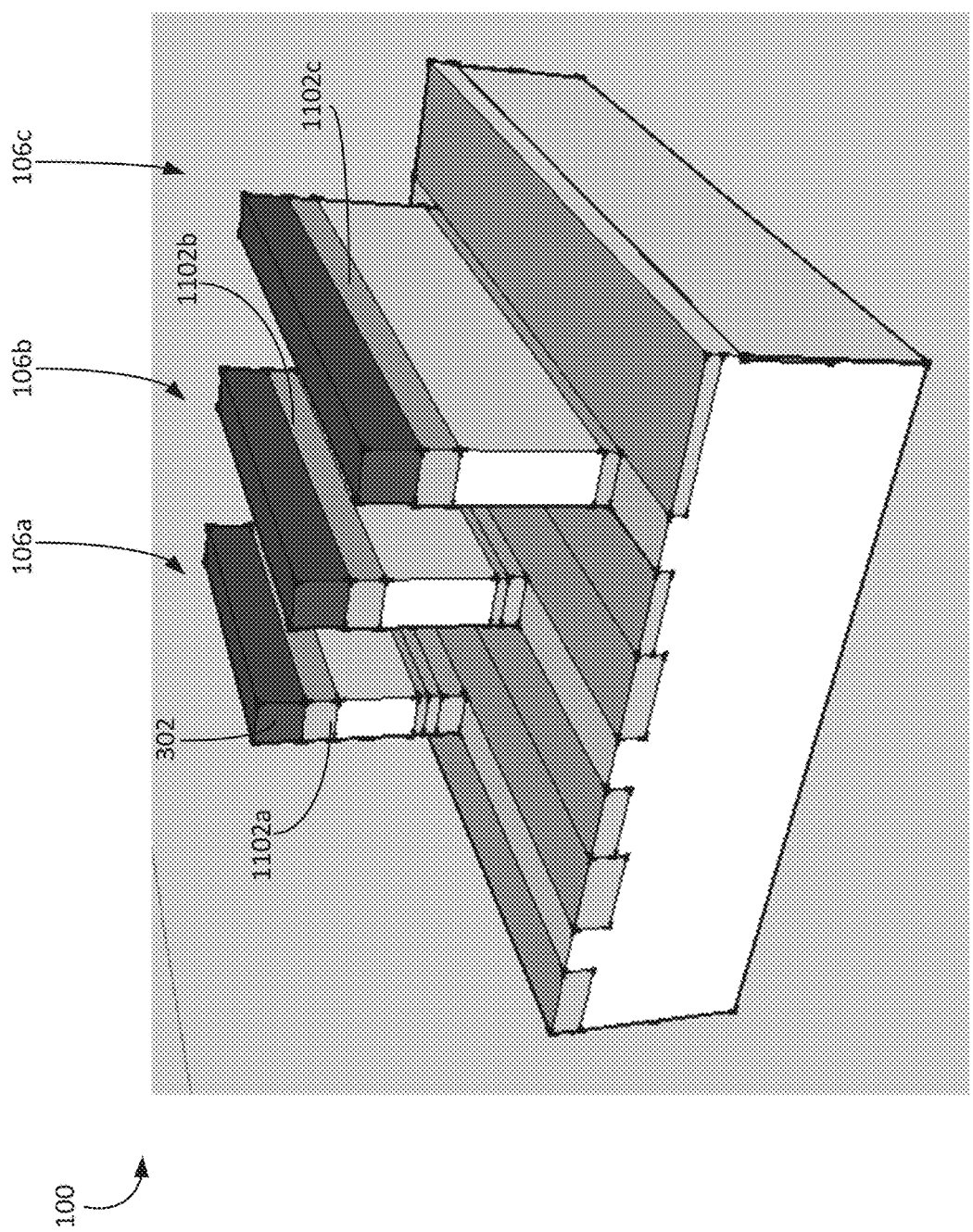
FIG. 11 is a perspective view schematic drawing of the semiconductor structure illustrated in FIG. 1 according to some embodiments.

With respect to FIG. 11, the semiconductor structure 100 is subjected to an implant operation according to some embodiments. Upon completing the third doping thermal diffusion operation, top dopant regions 1102a, 1102b, and 1102c are formed by zero degree implant through the Fin cap mask 302 according to some embodiments. The top dopant sections 1102a, 1102b, and 1102c are formed for the drain/sources 112a, 112b, and 112c in each of the Fin structures 106a, 106b, and 106c according to some embodiments. The top dopant regions 1102a, 1102b, and 1102c are on a top portion of the Fin structures 106a, 106b, and 106c as shown in FIG. 11 and right below the Fin HM Fin cap mask 302 of each Fin structure 106a-c according to some embodiments. The top dopant regions 1102a, 1102b, and 1102c are formed for the drain/sources 112a-c and connections thereto according to some embodiments. The top drain/source 112a-c and the bottom drain/sources 114a-c are arranged vertically with respect to one another such that a vertical transistor is formed according to some embodiments. The top dopant doping does not affect the diffused dopants at the bottom of the Fin structures 106a-c according to some embodiments.

Figure 12:
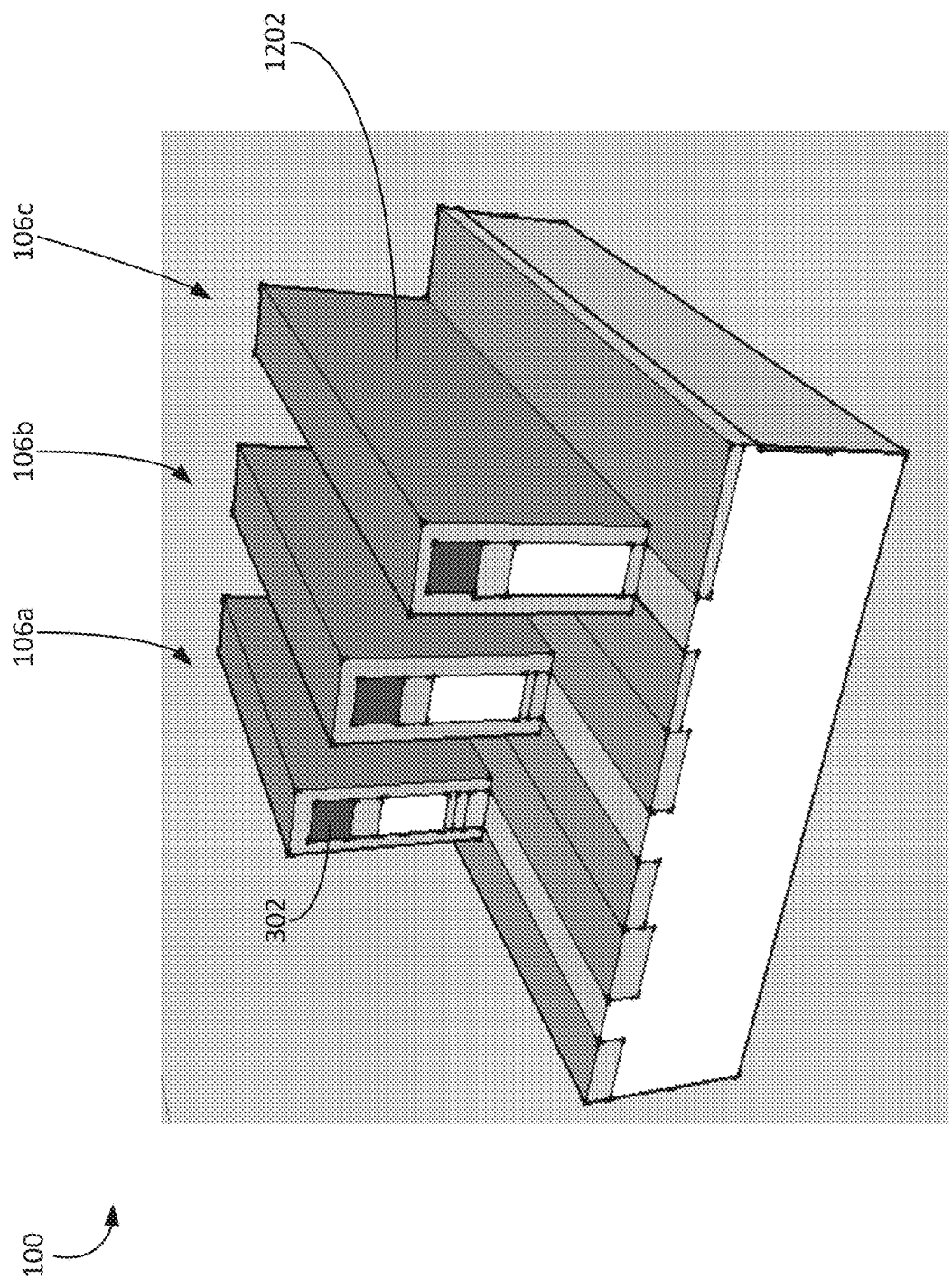
FIG. 12 is a perspective view schematic drawing of the semiconductor structure illustrated in FIG. 1 according to some embodiments.

With respect to FIG. 12, the semiconductor structure 100 is subjected to a gate structure formation operation according to some embodiments. Upon completing doping the top dopant regions 1102a, 1102b, and 1102c, a gate structure 1202 is formed to cover each Fin structure 106a, 106b, and 106c according to some embodiments. The gate structure 1202 is formed using any suitable dielectric material and conductive material. The gate dielectric material is a material, such as, high K dielectric, oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum. The conductive material can be doped polysilicon or metal. The gate structure 1202 is formed by suitable deposition processes, for example, CVD, PECVD, ALD, PVD, chemical solution deposition, or other like processes. The gate structure 1202 includes a stack of a polysilicon layer over a high K dielectric material in some embodiments. The gate structure 1202 is deposited conformally in some embodiments.

With reference to FIG. 1, a portion of the gate structure 1202 is removed (as shown in FIG. 1) to expose the Fin HM Fin cap mask 302 and at least a portion of the top dopant region 1102a, 1102b, and 1102c by anisotropic etching to leave the gate structure 1202 on the side walls of the Fin structures 106a, 106b, and 106c as the gates 110a-c according to some embodiments.

The Fin HM Fin cap mask 302 is also removed according to some embodiments. The drain/source 112a-c is formed at each top dopant region 1102a, 1102b, and 1102c by in-situ doped epitaxy according to some embodiments.

Figure 13:
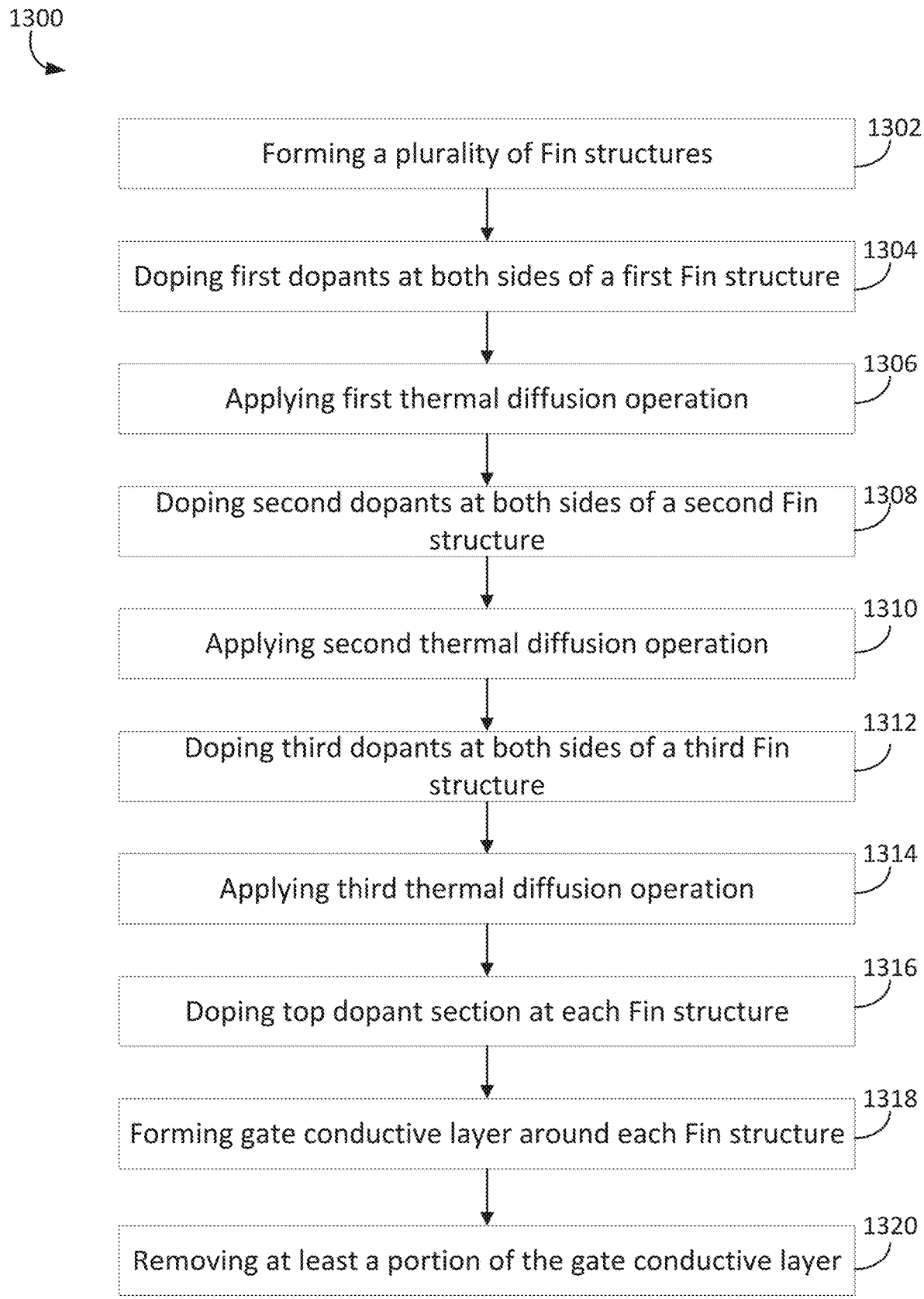
FIG. 13 is a flow diagram showing operations for fabricating a semiconductor structure with multiple gate length according to some embodiments.

With respect to FIG. 13, a flow 1300 for fabricating a semiconductor structure with multiple gate length is shown according to some embodiments. At an operation 1302, Fin structures including a first, a second, a third Fin structures are formed on a Fin HM layer of a substrate of a semiconductor structure according to some embodiments. Each Fin structure is formed with a mandrel and a SIT spacer surrounding the sidewalls of the mandrel according to some embodiments. A Fin HM cap is formed at top of each mandrel according to some embodiments.

At an operation 1304, first dopants are doped at both sides of the first Fin structure according to some embodiments. The dopants can be any suitable types dopants, such as positive-type (P-type) or negative-type (N-type) dopants according to some embodiments. The first dopants have thermal diffusion characteristics such that the dopants can diffuse into the Fin structure at a temperature threshold according to some embodiments.

At operation 1306, a first thermal diffusion operation is applied according to some embodiments. The semiconductor structure is applied to a first temperature that reaches or is above the temperature threshold according to some embodiments. At least a first portion of the first dopants continues diffusing into the first Fin structure under the first temperature according to some embodiments. In some embodiments, the first temperature is applied for a first period of time according to some embodiments. The first dopants stop diffusing into the first Fin structure after the first time of period according to some embodiments. The first period of time is determined according to gate length requirements of a first device that connects to the first Fin structure, a second device that connects to the second Fin structure, and a third device that connects to the third Fin structure according to some embodiments.

At operation 1308, second dopants are doped at both sides of the second Fin structure according to some embodiments. The second dopants are similar as the first dopants according to some embodiments.

At operation 1310, a second thermal diffusion operation is applied according to some embodiments. The semiconductor structure is applied to a second temperature that reaches or is above the temperature threshold according to some embodiments. The first dopants restart diffusing at least a second portion of the second dopants into the first Fin structure under the second temperature according to some embodiments. At the same time, the second dopants start diffusing at least a first portion of the first dopants into the second Fin structure according to some embodiments. In some embodiments, the second temperature is applied for a second period of time according to some embodiments. The second period of time occurs after the first period of time according to some embodiments. The first and the second dopants stop diffusion into both of the first and the second Fin structures after the second time period according to some embodiments. The second period of time is determined according to gate length requirements of a first device that connects to the first Fin structure, a second device that connects to the second Fin structure, and a third device that connects to the third Fin structure according to some embodiments.

At operation 1312, third dopants are doped at both sides of the third Fin structure according to some embodiments. The third dopants are similar as the first and the second dopants according to some embodiments.

At operation 1314, a third thermal diffusion operation is applied according to some embodiments. The semiconductor structure is applied to a third temperature that reaches or is above the temperature threshold according to some embodiments. The first dopants restart diffusing at least a third portion of the first dopants into the first Fin structure according to some embodiments. The second dopants restart diffusing at least a second portion of the second dopants into the second Fin structure under the third temperature according to some embodiments. At the same time, the third dopants start diffusing at least a first portion of the third dopants into the third Fin structure according to some embodiments. In some embodiments, the third temperature is applied for a third period of time according to some embodiments. The first, second, and third dopants stop diffusion into the first, the second, and the third Fin structures after the third period of time according to some embodiments. The third period of time occurs after the second period of time according to some embodiments. The third period of time is determined according to gate length requirements of a first device that connects to the first Fin structure, a second device that connects to the second Fin structure, and a third device that connects to the third Fin structure according to some embodiments.

At operation 1316, gate dopants are doped at a top dopant section of each Fin structure according to some embodiments. The top dopant section is used for forming a drain/source for connecting to the respective device according to some embodiments.

At operation 1318, a gate conductive layer is formed around each Fin structure according to some embodiments. The gate conductive layer is formed to over the top and sidewalls of each Fin structure according to some embodiments.

At operation 1320, at least a portion of the gate conductive layer is removed around the top portion of each Fin structure to a level that the HM cap and the top dopant section on top of each mandrel are exposed according to some embodiments. Each Fin structure has a gate formed by the top dopant section, the gate conductive layer, and the bottom dopant through thermal diffusions according to some embodiments. For example, a first gate is formed using the first, the second, and the third portions of the first dopants diffused in the first Fin structure, the second gate is formed using the first and the second portions of the second dopants diffused in the second Fin structure, and the third gate is formed using the first portion of the third dopants diffused in the third Fin structure according to some embodiments.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations. Further, the term drain/source region refers to a source region, a drain region, or a region that can be used as a source or a drain.

It should be understood that the circuits described above can provide multiple ones of any or each of those components. In addition, the structures, circuits and methods described above can be adjusted for various system parameters and design criteria, such as shape, depth, thicknesses, etc. Although shown in the drawings with certain components directly coupled to each other, direct coupling is not shown in a limiting fashion and is exemplarily shown. Alternative embodiments include circuits with indirect coupling between the components shown.

It should be noted that although the flowcharts provided herein show a specific order of method steps, it is understood that the order of these steps can differ from what is depicted. Also two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A method of fabricating a semiconductor structure, comprising:
    forming a plurality of Fin structures;
    doping first dopants at both sides of a first Fin structure of the plurality of Fin structures;
    providing a first thermal diffusion operation to the semiconductor structure;
    doping second dopants at both sides of a second Fin structure of the plurality of Fin structures; and
    providing a second thermal diffusion operation to the semiconductor structure,
    wherein a first gate length for the first Fin structure is formed using the first and the second thermal diffusion operations, and wherein a second gate length for the second Fin structure is formed using the second thermal diffusion operation, wherein the first gate length and the second gate length are different, wherein the first dopants and the second dopants are the same type or are different type dopants.

2. The method of fabricating the semiconductor structure of claim 1, wherein providing the first thermal diffusion operation comprises applying the semiconductor structure to a first temperature that reaches or is above a temperature threshold for a thermal diffusion operation of the semiconductor structure.

3. The method of fabricating the semiconductor structure of claim 2, wherein providing the first thermal diffusion operation comprises diffusing a first portion of the first dopants into the first Fin structure.

4. The method of fabricating the semiconductor structure of claim 3, wherein applying the second thermal diffusion operation comprises applying the semiconductor structure to a second temperature that reaches or is above the temperature threshold for the thermal diffusion operation of the semiconductor structure.

5. The method of fabricating the semiconductor structure of claim 4, wherein applying the second thermal diffusion operation comprises diffusing a second portion of the first dopants into the first Fin structure and diffusing a first portion of the second dopants into the second Fin structure.

6. The method of fabricating the semiconductor structure of claim 5, wherein a first drain/source region of the first Fin structure is formed using the first and the second portions of the first dopants diffused in the first Fin structure.

7. The method of fabricating the semiconductor structure of claim 6, wherein a second drain/source region of the second Fin structure is formed using the first portion of the second dopants diffused in the second Fin structure.

8. A method of fabricating a vertical transistor, comprising:
    forming a plurality of Fin structures in a semiconductor substrate;
    doping first dopants into a top surface of the semiconductor substrate at both sides of a first Fin structure of the plurality of Fin structures;
    providing a first thermal diffusion operation to the semiconductor substrate;
    doping second dopants into the top surface of the semiconductor substrate at both sides of a second Fin structure of the plurality of Fin structures; and
    providing a second thermal diffusion operation to the semiconductor substrate,
    wherein a first gate length for the first Fin structure is formed using the first and the second thermal diffusion operations, and wherein a second gate length for the second Fin structure is formed using the second thermal diffusion operation, wherein the first gate length and the second gate length are different, wherein the first dopants and the second dopants are the same type or are different type dopants.

9. The method of fabricating the vertical transistor of claim 8, wherein providing the first thermal diffusion operation comprises:
    applying the semiconductor substrate to a first temperature that reaches or is above a temperature threshold for a thermal diffusion operation of the semiconductor substrate; and
    diffusing a first portion of the first dopants into the first Fin structure.

10. The method of fabricating the vertical transistor of claim 8, wherein providing the second thermal diffusion operation comprises:
    applying the semiconductor substrate to a second temperature that reaches or is above a temperature threshold for a thermal diffusion operation of the semiconductor substrate; and
    diffusing a first portion of the second dopants into the second Fin structure.

11. The method of fabricating the vertical transistor of claim 10, wherein a first drain/source region comprises a first portion and a second portion of the first dopants diffused into the first Fin structure, and a second drain/source region comprises a first portion of the second dopants diffused into the second Fin structure.

12. The method of claim 8, wherein the first dopants and the second dopants are N-type or P-type.

13. The method of claim 8, further comprising:
    doping third dopants into the top surface of the semiconductor substrate at both sides of a third Fin structure of the plurality of Fin structures.

14. The method of claim 13, further comprising:
providing a third thermal diffusion operation to the semiconductor substrate, wherein a third gate length for the Fin structure is formed using the first, second, and third thermal diffusion operations.

15. The method of claim 8, wherein the first Fin Structure and the second Fin structure have different lengths.

16. The method of claim 13, wherein the first Fin Structure, the second Fin structure, and the third Fin structure have different lengths.

17. The method of claim 8, wherein a bottom drain/source region of the first Fin structure is formed using the first dopants.

18. The method of claim 8, further comprising:
doping third dopants into a top surface of the first Fin structure to form a top source/drain.

19. The method of claim 8, further comprising a gate conductor around three sides of the first Fin structure.

20. The method of claim 19, further comprising: removing a portion of the gate conductor.

* * * * *